United States Patent [19]

Konian et al.

[11] 4,283,640
[45] Aug. 11, 1981

[54] ALL-NPN TRANSISTOR DRIVER AND LOGIC CIRCUIT

[75] Inventors: Richard R. Konian, Poughkeepsie; James L. Walsh, Hyde Park, both of N.Y.

[73] Assignee: International Business Machines Corp., Armonk, N.Y.

[21] Appl. No.: 82,256

[22] Filed: Oct. 5, 1979

[51] Int. Cl.$^3$ .................. H03K 19/00; H03K 3/26
[52] U.S. Cl. .................... 307/270; 307/254; 307/296 R; 307/454
[58] Field of Search ............ 307/270, 254, 296, 297, 307/215, 218; 330/273

[56] References Cited
U.S. PATENT DOCUMENTS

| | | | |
|---|---|---|---|
| 3,358,154 | 12/1967 | Hung | 307/215 |
| 3,549,899 | 12/1970 | Beelitz | 307/215 |
| 3,564,281 | 12/1971 | Tokunaga | 307/214 |
| 3,699,355 | 10/1972 | Madrazo et al. | 307/215 |
| 3,914,628 | 10/1975 | Pao et al. | 307/270 |

Primary Examiner—Stanley D. Miller, Jr.
Assistant Examiner—B. P. Davis
Attorney, Agent, or Firm—Robert J. Haase

[57] ABSTRACT

An all-NPN bipolar transistor driver circuit characterized by low standby power dissipation and fast response, particularly at high input driving conditions. The bases of a pair of NPN transistors are commonly connected to an input terminal. The emitter of a third NPN transistor is connected to the collector of one transistor of the transistor pair and to an output terminal. The collector of the other transistor of the transistor pair is connected to the base of the third NPN transistor. The base and collector of the third NPN transistor are coupled to a first biasing means. The emitters of the transistor pair are connected to a second biasing means through respective resistors so that those emitters may be independently biased. The values of the biasing means are set, relative to the lowest input voltage excursion occurring at the input terminal so that no current flows through transistor pair during the lowest input voltage excursion. Various circuit extensions, based on the above driver circuit, are also described to provide logic functions represented by output logic signals which are in-phase as well as out-of-phase relative to the applied input logic signals.

9 Claims, 3 Drawing Figures

ALL-NPN TRANSISTOR DRIVER AND LOGIC CIRCUIT

BACKGROUND OF THE INVENTION

1. Field of the Invention

The invention generally relates to driver and logic circuits utilizing solely NPN-type transistors and, more particularly, to such circuits characterized by low power dissipation and high speed in responding to input signal transitions of either increasing or decreasing sense.

2. DESCRIPTION OF THE PRIOR ART

One technique for providing logic and driver circuits having fast response times and low standby power dissipation uses complementary bipolar transistors. Such circuits are described in copending patent applications Ser. No. 82,254 filed on Oct. 5, 1979 for "Complementary Transistor Inverting Emitter Follower Circuit" in the names of Joseph R. Cavaliere et al and Ser. No. 82,255 filed on Oct. 5, 1979 for "Complementary Transistor Inverting Emitter Follower Circuit" in the names of Richard R. Konian et al. Both of the aforesaid applications make use of an emitter follower series-connected pair of complementary transistors. The former application describes a second pair of complementary transistors, which includes a high performance PNP transistor, for driving the emitter follower transistor pair at high speed. The latter application describes a modified arrangement for driving the emitter follower transistor pair without using any high performance PNP transistor, to eliminate the need for relatively complex and costly high performance PNP technology while retaining most of the high speed and low power dissipation advantages of the circuit disclosed in the former patent application.

It remains desirable, however, that driver and logic integrated circuits, having low standby power dissipation and fast response, be realized using only NPN bipolar transistor technology throughout the entire integrated circuit chip. Preferably the desired circuit should be faster and have a lower speed-power product than prior art, all-NPN, current switch emitter follower circuits which heretofore have been noted for fast response speed in logic applications.

SUMMARY OF THE INVENTION

An all-NPN low voltage, low power, driver circuit is disclosed providing high drive at faster speeds and with lower speed-power product than prior art current switch emitter follower circuits. The driver circuit comprises a pair of NPN transistors having bases commonly connected to an input terminal. A third NPN transistor is connected in series circuit with one transistor of the transistor pair. The junction between the series-connected transistors is coupled to an output terminal. The transistors are biased through respective resistors so that no current flows through at least said one transistor of the transistor pair during the lowest voltage excursion at the input terminal. On positive-going input voltage transitions, the commonly connected bases are pulled up while capacitance in the corresponding emitter circuits tends to hold the emitters down, producing fast "turn on" of both transistors. One of the paired transistors quickly discharges any load capacitance connected to the output terminal. During the positive-going transistions, the other of the paired transistors holds the third transistor off and clamps the output node voltage at its final "down" level value. On negative-going input voltage transitions, both of the paired transistors quickly turn off and drive the third transistor to quickly charge any load capacitance connected to the output terminal.

In general, the driver circuit of the present invention draws current about 50% of the time and therefore does not have as good a speed-power product at low power as the complementary circuits described in the aforementioned patent applications. However, the present driver circuit has a better speed-power product at high power than said complementary circuits.

Various circuit extensions of the present driver circuit are disclosed to provide driver and logic functions represented by output logic signals which are in-phase and out-of-phase relative to the applied input logic signals.

DESCRIPTION OF THE PREFERRED EMBODIMENTS

Figure 1:
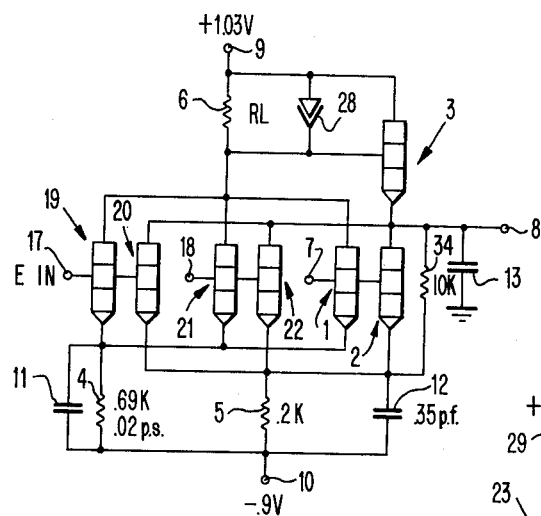
FIG. 1 is a simplified schematic diagram of a preferred driver and logic circuit species of the present invention.

The basic driver circuit, utilized throughout the various embodiments of the present invention comprises NPN transistors 1, 2 and 3 and resistors 4, 5 and 6 as shown in FIG. 1. The bases of transistor pair 1 and 2 are commonly connected to input terminal 7. The emitter of a third NPN transistor 3 is connected to the collector of transistor 2 and to output terminal 8. The collector of transistor 1 is coupled to the base of transistor 3 and, via biasing resistor 6, and Schottky diode 28, to a source of positive potential 9. The collector of transistor 3 is directly connected to source 9. The emitters of transistors 1 and 2 are connected to a source of negative potential 10 through resistors 4 and 5, respectively so that the emitters may be independently biased. Resistors 4 and 5 preferably are shunted by capacitors 11 and 12, respectively.

The values of sources 9 and 10 and biasing resistors 4, 5 and 6 are set, relative to the lowest input voltage excursion at terminal 7 so that no current flows through transistors 1 and 2 during the lowest input voltage excursion. On positive-going input voltage transitions at terminal 7, the commonly connected bases of transistors 1 and 2 are pulled up while capacitors 11 and 12 tend to hold the respective emitters of transistors 1 and 2 down. The result is that both transistors 1 and 2 are turned on rapidly. Conducting transistor 1 holds transistor 3 off to allow conducting transistor 2 to rapidly discharge any capacitance (represented by capacitor 13) associated with output terminal 8 to its final "down" level value. On negative-going input voltage transitions at terminal 7, both transistors 1 and 2 quickly turn off. Non-conducting transistor 1 drives the base of transistor 3 in a positive direction, turning transistor 3 on and rapidly charging capacitor 13. Thus the output signal at terminal 8 is out-of-phase with respect to the input signal at terminal 7. Resistor 34 preferably is used to stabilize the output "up" level value for circuit fan-out in the range from 1 to 10.

Inasmuch as the driver circuit described above draws current about 50% of the time (when input voltage excursions occur at terminal 7 in a positive-going direction), the speed-power product (figure of merit) at low power is reduced relative to the speed-power product exhibited by the complementary circuit described in aforementioned copending application Ser. No. 82,254. However, the present driver circuit has a better speed-power product at high power than said complementary circuit. This may be seen by reference to FIG. 2.

Figure 2:
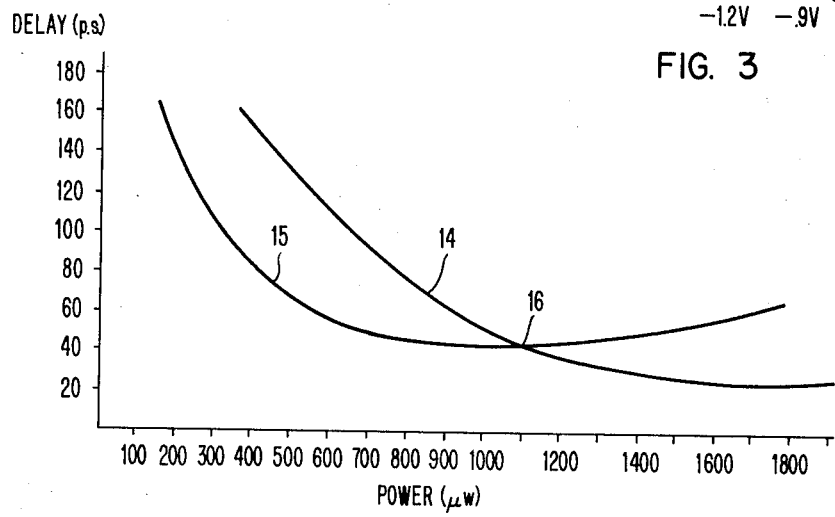
FIG. 2 is a comparative plot of the speed-power characteristic of the circuit of FIG. 1 relative to the circuit of aforementioned copending patent application Ser. No. 82,254.

Curve 14 of FIG. 2 is a plot of the output delay (inverse measure of speed) versus input power characteristic of the present driver circuit. Curve 15 is the comparable plot representing the complementary circuit described in said copending Ser. No. 82,254. It can be seen that for a given delay (below 1200 micro watts of input power), the circuit of the present invention requires relatively higher input power than the complementary circuit. However, when the input power increases to 1200 micro watts at cross-over point 16, the situation begins to reverse. That is, at all input power levels above 1200 micro watts, the circuit of the present invention produces less delay, i.e., it is a faster responding circuit than is the complementary circuit. This improved behavior of the present drive circuit is attributed to the facts that fewer devices are connected between input and output and that every transistor is switched by a low impedance driver source (from the previous stage which is a replication of the same circuit). The values of the delay and power coordinates discussed above were obtained using a particular bipolar device technology. Substantially the same magnitude of the relative circuit performance improvement is obtainable, however, with different bipolar deivces technologies, although the absolute values of the delay and power coordinates may be different.

Returning to FIG. 1, provision also is made for performing logic. A plurality of input terminals 17, 18 and 7 receive respective independent logic input signals. The additional input terminals 17 and 18 are provided by replicating the structure and function of transistors pair 1 and 2 and connecting the replicated pairs in parallel with the original pair 1 and 2. That is the emitters and collectors of common base-connected transistors 21, and 22 are similarly connected, respectively, to the emitters and collectors of transistors 1 and 2. The output signal at terminal 8 rises whenever the input signal falls at any or all of input logic terminals 17, 18 or 7 in conventional NOR logic fashion.

Figure 3:
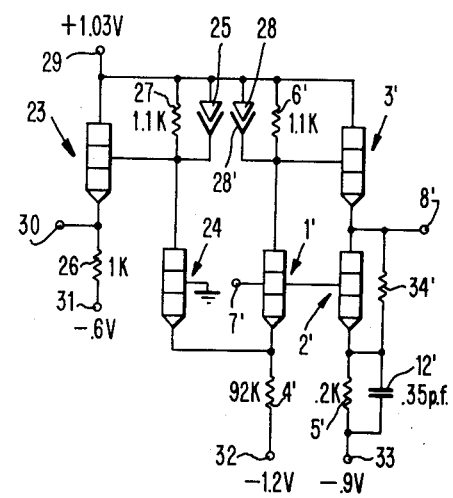
FIG. 3 is a simplified schematic diagram of a driver species of the invention providing outputs in phase opposition to each other.

FIG. 3 shows an adaptation of the driver circuit of FIG. 1 to produce two output signals in phase opposition with respect to each other. Corresponding driver circuit components are designated by primed numerals in FIG. 3. The capacitor 11 of FIG. 1 has been omitted in the corresponding driver circuit of FIG. 3 in order not to delay the in-phase output signal (produced by transistors 23 and 24, Schottky diode 25 and resistors 26 and 27) relative to the out-of-phase output signal at terminal 8'.

The emitter of grounded base transistor 24 is driven from the emitter 1'. The collector of transistor 24 and the base of transistor 23 are coupled to the positive voltage source 29 via resistor 27 connected in parallel with Schottky diode 25. The collector of transistor 23 is directly connected to source 29. The emitter of transistor 23 is connected to in-phase output terminal 30 and, via resistor 26 to negative voltage source 31.

The emitter-connected transistors 24 and 1' form a current switch which switches the current flowing through resistor 4' alternatively through transistor 24 or transistor 1' depending on whether the potential at the emitter of transistor 1' is below or above, respectively, the potential at the grounded base of transistor 24. Thus, the current varies but does not stop flowing through resistor 4' as the input signal at terminal 7' goes through its lowermost excursion. In this one respect, the driver circuit designated by the primed reference numerals departs from the operation of the corresponding driver circuit of FIG. 1. Correspondingly, the emitter resistors 4' and 5' are returned to separate negative voltage sources 32 and 33 rather than to a single source 10' as in the case of FIG. 1. Transistor 2', however, is turned on and off during the upper and lower excursions of the input signal at terminal 7' as is the case with corresponding transistor 2 of FIG. 1.

Emitter follower 24 couples the signal at the collector of transistor 24 to output terminal 30. As a result of the lack of phase inversion produced in any of transistors 1', 24 or 23, the output signal at terminal 30 is in phase with the input signal at terminal 7'. As previously explained in connection with FIG. 1, the output signal at terminal 8' is out-of-phase with respect to the input signal at terminal 7'.

The circuit parameter values shown adjacent the respective elements in the Figures are presently preferred for optimum performance and noise margin.

Having thus described my invention, what I claim as new, and desire to secure by Letters Patent is:

1. An NPN transistor driver circuit comprising:
   a first pair of NPN transistors,
   the base of said pair of transistors being connected to an input terminal,
   a third NPN transistor,
   the emitter of said third transistor being connected to the collector of one transistor of said transistor pair and to an output terminal,
   the collector of the other transistor of said transistor pair being connected to the base of said third transistor,
   the base and collector of said third transistor being connected to first biasing means,
   a pair of resistors,
   the emitters of the transistors of said transistor pair being connected through respective ones of said pair of resistors to second biasing means,
   a source of first input signal coupled to said input terminal,
   the voltages of said first and second biasing means being set relative to the lowest voltage excursion of said input signal, so that substantially no current flows through at least said one transistor of said transistor pair during said lowest voltage excursion.

2. The circuit defined in claim 1 wherein each of said resistors is shunted by a respective capacitor.

3. The circuit defined in claim 1 wherein said output terminal is connected to a capacitive load.

4. The circuit defined in claim 1 wherein the voltages of said first and second biasing means are set, relative to the lowest voltage excursion of said input signal, so that substantially no current flows through either of said transistors of said transistor pair during said lowest voltage excursion.

5. The circuit defined in claim 4 and further including additional pairs of NPN transistors,
  each said additional pair of transistors being connected in parallel with said first pair of transistors,
  each said additional pair of transistors having commonly connected bases, and
  additional sources of input signals,
  each said additional source being connected to a respective one of said additional pairs of transistors.

6. The circuit defined in claim 1 and further including circuit means coupled to the emitter of said other transistor of said transistor pair for providing an output signal which is in phase with respect to said first input signal.

7. The circuit defined in claim 6 wherein said circuit means, together with said other transistor of said transistor pair, comprises a current switch.

8. The circuit defined in claim 7 wherein said pair of resistors connect said emitters of said transistors of said first pair of transistors to respective biasing means.

9. The circuit defined in claim 8 wherein only said resistor connected to the emitter of said one transistor of said transistor pair is shunted by a capacitor.

* * * * *